United States Patent
Yamada et al.

(10) Patent No.: US 9,591,701 B2
(45) Date of Patent: Mar. 7, 2017

(54) EL DISPLAY DEVICE

(71) Applicant: Japan Display Inc., Tokyo (JP)

(72) Inventors: Yasuyuki Yamada, Tokyo (JP); Tomoki Nakamura, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/670,176

(22) Filed: Mar. 26, 2015

(65) Prior Publication Data

US 2015/0282259 A1    Oct. 1, 2015

(30) Foreign Application Priority Data

Mar. 27, 2014    (JP) .................. 2014-065924

(51) Int. Cl.
| | |
|---|---|
| *H05B 33/04* | (2006.01) |
| *H05B 33/10* | (2006.01) |
| *H05B 33/12* | (2006.01) |
| *H01L 51/52* | (2006.01) |

(52) U.S. Cl.
CPC ......... *H05B 33/04* (2013.01); *H01L 51/5246* (2013.01); *H05B 33/10* (2013.01); *H05B 33/12* (2013.01); *H01L 51/524* (2013.01); *H01L 2251/566* (2013.01)

(58) Field of Classification Search
None
See application file for complete search history.

(56) References Cited

U.S. PATENT DOCUMENTS

| | | |
|---|---|---|
| 2005/0212413 A1 | 9/2005 | Matsuura et al. |
| 2012/0146493 A1* | 6/2012 | Ra .................. H01L 27/3276 313/512 |

FOREIGN PATENT DOCUMENTS

| | | |
|---|---|---|
| CN | 1671255 A | 9/2005 |
| CN | 1735292 A | 2/2006 |
| JP | H11-144865 A | 5/1999 |
| JP | 2002-299044 A | 10/2002 |
| JP | 2007-052966 A | 3/2007 |
| JP | 2013-065830 A | 4/2013 |
| KR | 10-2006-0066641 A | 6/2006 |

(Continued)

OTHER PUBLICATIONS

Chinese Office Action issued Jul. 28, 2016 for corresponding Chinese Application No. 201510138136.3.

(Continued)

*Primary Examiner* — Ashok Patel
(74) *Attorney, Agent, or Firm* — Typha IP LLC

(57) ABSTRACT

A color filter type EL display device in which the deterioration of a light-emitting layer is prevented, which can be manufactured by a gang-printing method, and whose cost in manufacture is reduced includes: a display area having a plurality of pixels; a frame area surrounding the display area; lower electrodes each formed in each of pixels; an insulating layer separating the pixels; a light-emitting EL layer formed on the lower electrodes and the insulating layer so as to straddle the plurality of pixels; an upper electrode formed on the EL layer so as to straddle the plurality of pixels; and a sealing layer formed on the upper electrode. In the frame area, the upper electrode and the insulating layer contact each other, or the sealing layer and the insulating layer contact each other, so as to surround the display area.

5 Claims, 8 Drawing Sheets

(56) References Cited

FOREIGN PATENT DOCUMENTS

KR  10-2010-0109867 A  10/2010

OTHER PUBLICATIONS

Korean Office Action mailed on Jun. 20, 2016, for corresponding Korean Patent Application No. 10-2015-0040677 with Partial Translation.

* cited by examiner

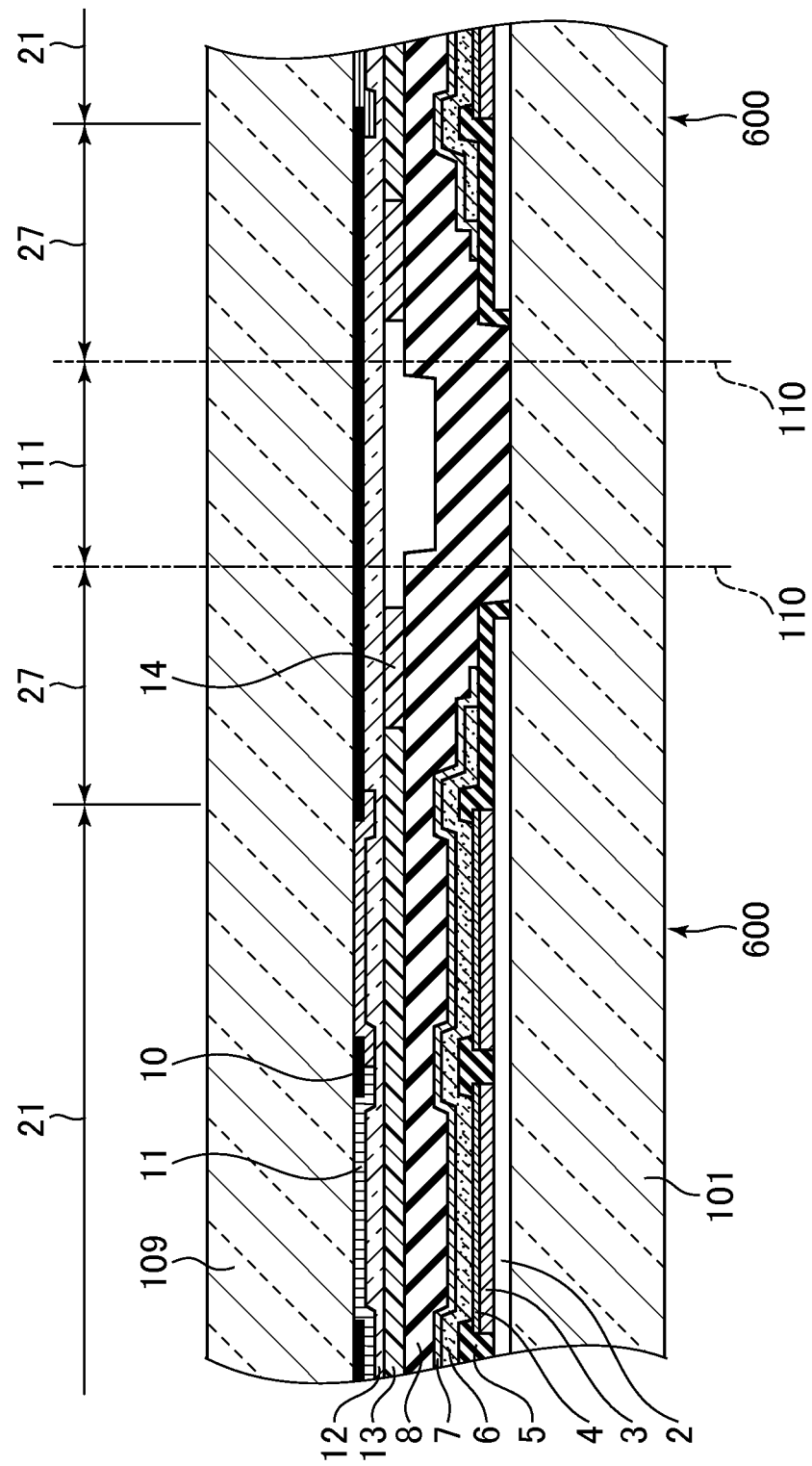

EL DISPLAY DEVICE

CROSS-REFERENCE TO RELATED APPLICATION

The present application claims priority from Japanese application JP 2014-065924 filed on Mar. 27, 2014, the content of which is hereby incorporated by reference into this application.

BACKGROUND OF THE INVENTION

1. Field of the Invention

The present invention relates to an EL display device and a method for manufacturing the same.

2. Description of the Related Art

In full-color electroluminescent (hereinafter referred to as "EL") display devices that are required to be of high definition and small size in applications such as being mounted in small devices such as mobile devices, the size of individual pixels is reduced, and it is thus difficult to color an EL layer as a light-emitting layer in different colors so as to emit different colored lights in respective pixels. Therefore, an EL display device of color filter type has been proposed.

In such a type of EL display device, full-color display is realized by providing a common white light-emitting layer that straddles all pixels, and disposing color filters above the white light-emitting layer, as disclosed in, for example, JP 2002-299044 A.

In the manufacture of a so-called planar display, in general, a method is widely performed, for reducing the cost and lead time per product, in which a number of display devices are previously made on a large-sized glass substrate called a mother glass in manner of so-called gang printing (by which multiple pieces are obtained from one substrate) and the mother glass is cut after the end of the process to obtain a number of individual display devices.

When the mother glass is cut after a number of display devices are made with the light-emitting layer formed so as to straddle the entire surface of the mother glass, the light-emitting layer is exposed to the outside at the cut plane. An EL material used for the light-emitting layer is unstable to moisture or oxygen, and therefore, the light-emitting layer is deteriorated due to the moisture or oxygen entered from the exposed portion.

The invention has been made in view of the points described above, and it is an object of the invention to prevent the deterioration of a light-emitting layer in a color filter type EL display device, enable the manufacture of the EL display device by a gang-printing method, and reduce the cost in manufacture.

SUMMARY OF THE INVENTION

A typical outline of the invention disclosed herein will be described below.

(1) An EL display device includes: a display area having a plurality of pixels; a frame area surrounding the display area; lower electrodes each formed in each of the pixels; an insulating layer separating the pixels; a light-emitting EL layer formed on the lower electrodes and the insulating layer so as to straddle the plurality of pixels; an upper electrode formed on the EL layer so as to straddle the plurality of pixels; and a sealing layer formed on the upper electrode, wherein in the frame area, the upper electrode and the insulating layer contact each other, or the sealing layer and the insulating layer contact each other, so as to surround the display area.

(2) The EL display device according to (1), wherein in the frame area, the upper electrode and the insulating layer contact each other, and the sealing layer and the insulating layer contact each other, so as to surround the display area.

(3) The EL display device according to (1) or (2), wherein in the frame area, a groove is formed in the EL layer or the EL layer and the upper electrode so as to surround the display area, and the upper electrode and the insulating layer or the sealing layer and the insulating layer contact each other at the groove.

(4) The EL display device according to (3), wherein the upper electrode and the insulating layer contact each other at the groove, and the sealing layer and the insulating layer contact each other on an outer peripheral side of the groove.

(5) The EL display device according to (1), wherein a second sealing layer is formed on the upper electrode, and the sealing layer and the insulating layer contact each other on an outer peripheral side of the second sealing layer.

(6) A method for manufacturing an EL display device, includes: forming lower electrodes each in each of pixels and an insulating layer separating the pixels; forming, on the lower electrodes and the insulating layer, a light-emitting EL layer so as to straddle the plurality of pixels; partially removing, in a frame area surrounding a display area having the plurality of pixels, the EL layer so as to surround the display area; and forming, on the EL layer, an upper electrode so as to straddle the plurality of pixels and contacting the upper electrode with the insulating layer so as to surround the display area.

(7) A method for manufacturing an EL display device, includes: forming lower electrodes each in each of pixels and an insulating layer separating the pixels; forming, on the lower electrodes and the insulating layer, a light-emitting EL layer so as to straddle the plurality of pixels; forming, on the EL layer, an upper electrode so as to straddle the plurality of pixels; partially removing, in a frame area surrounding a display area having the plurality of pixels, the EL layer and the upper electrode so as to surround the display area; and forming a sealing layer on the upper electrode and contacting the sealing layer with the insulating layer so as to surround the display area.

(8) The method for manufacturing an EL display device according to (6) or (7), wherein the removing of the EL layer or the removing of the EL layer and the upper electrode in the frame area is performed by a laser ablation method or by stripping a sacrificial layer previously formed on the insulating layer.

(9) The method for manufacturing an EL display device according to (7), wherein the removing of the EL layer and the upper electrode in the picture-frame area is performed by dry etching using, as a protective layer, a second sealing layer formed on the upper electrode.

BRIEF DESCRIPTION OF THE DRAWINGS

FIG. 8 is a schematic view of a cross-section of an EL display device according to a sixth embodiment of the invention, taken along the line III-III in FIG. 2.

DETAILED DESCRIPTION OF THE INVENTION

Embodiment 1

Hereinafter, an EL display device 100 according to a first embodiment of the invention will be described with reference to the drawings.

Figure 1:
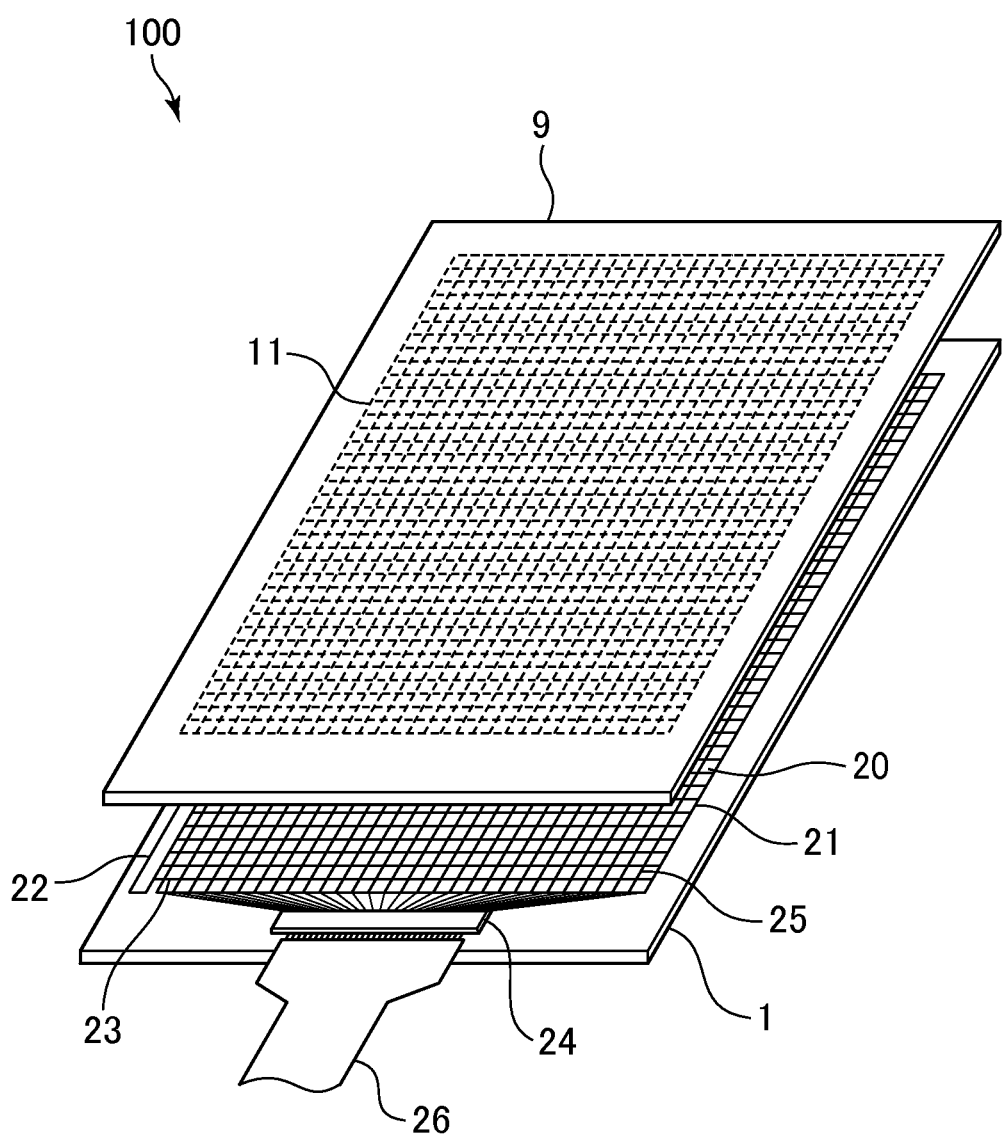
FIG. 1 is a schematic exploded perspective view of an EL display device according to a first embodiment of the invention.

FIG. 1 is a schematic exploded perspective view of the EL display device 100 according to the first embodiment of the invention. The EL display device 100 is provided with a rectangular display area 21 as an area in which pixels 20 are disposed on a front surface of a rectangular array substrate 1. A scanning circuit 22 is disposed adjacent to the left or right side, or both the sides of the display area 21. In the embodiment, the scanning circuit 22 is provided only on the left side of the display area 21. A number of scanning signal lines 23 extend from the scanning circuit 22 to the display area 21. The scanning circuit 22 may be provided by making a circuit itself directly on the surface of the array substrate 1 using a technique such as so-called SOG (System On Glass) as shown in the drawing, or may be provided by mounting a semiconductor chip. A driver circuit 24 is provided adjacent to a near side of the display area 21. A number of video signal lines 25 extend from the driver circuit 24 to the display area 21, and are orthogonal to the scanning signal lines 23. One pixel 20 is disposed to be connected to the scanning signal line 23 and the video signal line 25. Similarly to the scanning circuit 22, the driver circuit 24 may be provided by making the circuit directly on the surface of the array substrate 1, but, in the embodiment, the driver circuit 24 is provided by mounting a semiconductor chip. An FPC (Flexible Printed Circuit) 26 is connected to the driver circuit 24 and supplies image data from an external device to the driver circuit 24.

Further, a sealing substrate 9 is disposed on the front surface side of the array substrate 1. On a rear surface of the sealing substrate 9, color filters 11 are formed at positions corresponding to the pixels 20 in the display area 21 (shown by broken lines in the drawing). The sealing substrate 9 is smaller in dimension than the array substrate 1, so that the driver circuit 24 and the FPC 26 are not covered with the sealing substrate 9 but exposed. In the embodiment, the dimension of the sealing substrate 9 in the depth direction (long side) in the drawing is smaller than the dimension of the array substrate 1 in the depth direction, while the dimension of the sealing substrate 9 in the width direction (short side) in the drawing is the same as the dimension of the array substrate 1 in the width direction. In the specification, the "front surface" and "rear surface" are used as terms indicating a surface on the side facing a viewer of the EL display device 100 and a surface facing opposite to the front surface, respectively.

The image data supplied from the external device is converted by the driver circuit 24 into a voltage signal indicating the luminance of each of the pixels 20. The voltage signal is outputted to the video signal line 25 and supplied to the pixel 20 corresponding to the scanning signal line 23 selected by the scanning circuit 22. The pixel 20 emits light, with a pixel circuit provided for each of the pixels 20, at a luminance in response to the supplied voltage signal. In this manner, a number of pixels 20 provided in a grid shape in the display area 21 emit light at luminances corresponding to given image data, whereby the EL display device 100 forms an image in the display area 21.

Figure 2:
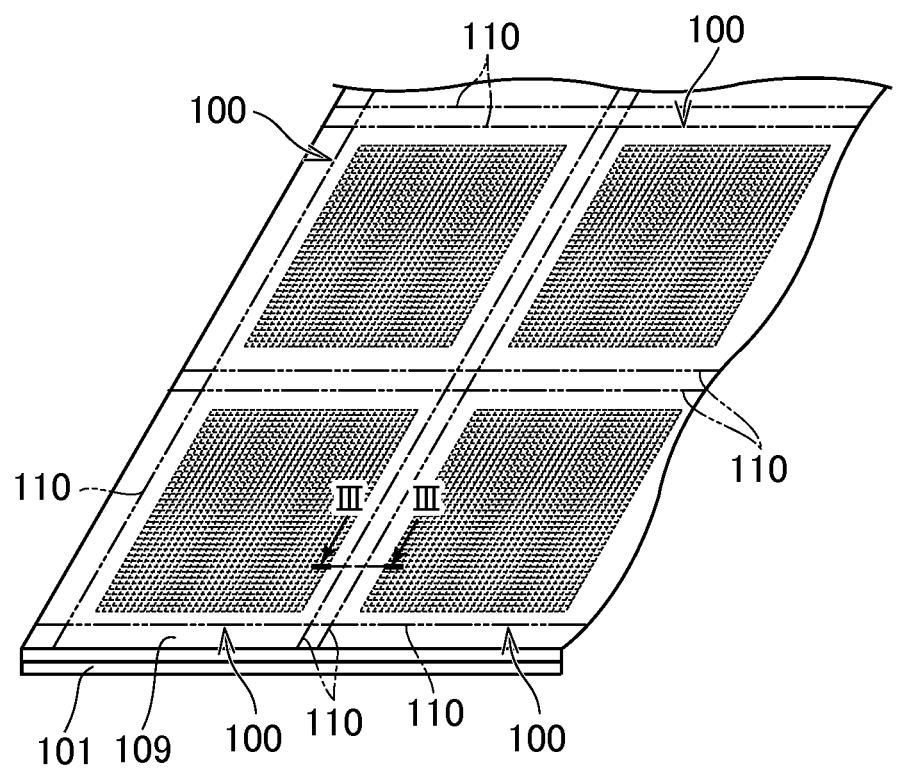
FIG. 2 is a schematic perspective view showing a state where EL display devices during manufacture are formed on a mother glass before division.

FIG. 2 is a schematic perspective view showing a state where EL display devices 100 during manufacture are formed on a mother glass before division. The mother glass is obtained by bonding a large-sized array mother substrate 101 with a sealing mother substrate 109 having the same shape and size as those of the array mother substrate 101. In a plane of the mother glass, a number of EL display devices 100 are regularly arranged in a grid shape. In the drawing, cut lines 110 at which the mother glass is cut in a later process are shown.

Figure 3:
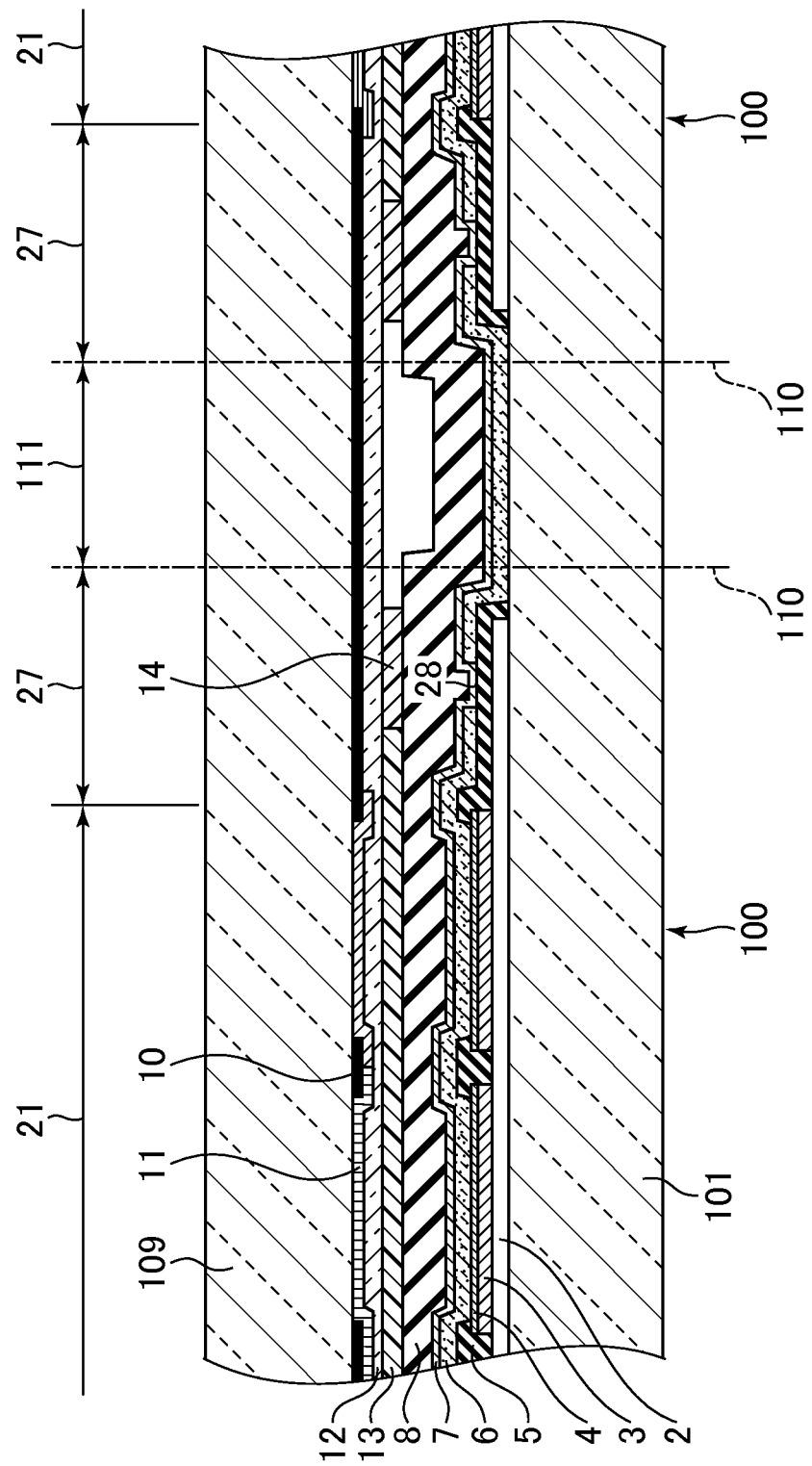
FIG. 3 is a schematic view of a cross-section taken along the line III-III in FIG. 2.

FIG. 3 is a schematic view of a cross-section taken along the line in FIG. 2. The cross-section is a cross-section at a position straddling two adjacent EL display devices 100 on the mother glass.

The EL display device 100 includes the display area 21 and a picture-frame area 27 as an area around the display area 21. In the display area 21, a number of pixels are regularly disposed on the array mother substrate 101 having an insulating property, and an image is formed by controlling the amount of light emission of an EL layer 6 at a position corresponding to each of the pixels. A circuit layer 2 in which electric circuits each composed of a TFT (Thin Film Transistor) or the like for controlling the amount of current flowing into the pixel are regularly (in a grid shape in the embodiment) disposed is formed on the array mother substrate 101. Although the array mother substrate 101 is a glass substrate in the embodiment, the material is not particularly limited as long as the substrate is an insulative substrate, and a synthetic resin or other materials may be used. Moreover, it does not matter whether the material is transparent or not.

The circuit layer 2 includes an appropriate insulating layer, wires including the scanning signal lines, the video signal lines, a power line, and a grounding wire, and TFTs composed of gate, source, and drain electrodes and a semiconductor layer. The electric circuits constituting the circuit layer 2 and the cross sectional structure thereof are of well-known type. Therefore, the details thereof are omitted herein, and these are simplified and shown only as the circuit layer 2.

Reflective layers 3 are provided on the circuit layer 2 independently for each of the pixels. The reflective layer 3 has a function of reflecting light emitted from the EL layer 6 provided above the reflective layer 3. The reflective layer 3 may be formed of an appropriate metal film, and, for example, aluminum, chromium, silver, or an alloy of these metals may be used. The reflective layers 3 may be omitted, in which case lower electrodes 4, which will be described next, serve also as the reflective layers 3. Alternatively, when the reflective layer 3 and the lower electrode 4 are insulated from each other with any insulating layer or the like, the reflective layers 3 do not have to be provided independently for each of the pixels. For example, the reflective layer 3 may be provided so as to cover the entire surface of the display area 21 (refer to FIG. 2).

On the reflective layer 3, the lower electrode 4 is provided in each of the pixels. The lower electrodes 4 are separated and insulated from each other by a pixel separation film 5 (also referred to as a bank) as an insulating layer. The lower electrode 4 is a transparent conductive film, for which a conductive metal oxide such as ITO (indium tin oxide) or InZnO (indium zinc oxide), one obtained by mixing a metal such as silver or magnesium into the conductive metal oxide, or one obtained by stacking a metal thin film such as silver or magnesium on the conductive metal oxide is preferably used. When the lower electrode 4 serves also as the reflective layer 3, the lower electrode 4 may be formed as a mere metal thin film. The pixel separation film 5 may be any film as long as the film is formed of an insulating material, and the pixel separation film 5 may be formed of an organic insulating material such as polyimide or acrylic resin, or silicon nitride. The pixel separation film 5 is disposed along each boundary between the pixels, and separates the pixels from each other. In the embodiment, the pixel separation film 5 is polyimide.

The EL layer 6 is provided on the lower electrodes 4 and the pixel separation films 5. The EL layer 6 is provided, not independently for each of the pixels, but in common to the pixels on the entire surface of the display area 21. Therefore, the EL layer 6 is provided also on the pixel separation films 5. The luminescent color of the EL layer 6 is white. The emission of white light is generally obtained as a combined color by stacking EL materials emitting lights of multiple colors of, for example, red, green, and blue, or yellow and blue. In the embodiment, a specific configuration of the EL layer 6 is not particularly limited, and any types of layers, a single layer or a stacked layer, and any structures of the layers may be used as long as white light emission is obtained in the end. Moreover, a material constituting the EL layer 6 may be organic or inorganic, but an organic material is used in the embodiment.

Further, an upper electrode 7 is provided on the EL layer 6. Also, the upper electrode 7 is provided, not independently for each of the pixels, but in common to the pixels on the entire surface of the display area 21. The upper electrode 7 is also a transparent conductive film, for which one obtained by mixing a metal such as silver or magnesium into a conductive metal oxide such as ITO or InZnO, one obtained by stacking a metal thin film such as silver or magnesium on the conductive metal oxide, or a mere metal thin film is preferably used.

A sealing layer 8 is provided on the front surface side of the array substrate 1, so that the entry of oxygen or moisture into the layers including the EL layer 6 is prevented and the layers are protected. The sealing layer 8 may be composed of any material exhibiting excellent protection performance, for example, an inorganic insulating material such as silicon nitride, silicon oxide, or silicon oxynitride, or an appropriate organic material. Moreover, the sealing layer 8 may be composed of multiple different materials stacked on each other. For the sealing layer 8, a transparent material is selected.

The sealing mother substrate 109, which is provided so as to face the array substrate 1, is disposed. On a rear surface of the sealing mother substrate 109, that is, on a surface facing the array substrate 1, a black matrix 10 is formed at portions each corresponding to a boundary between the pixels, and further, the color filters 11 of colors respectively corresponding to the luminescent colors of the pixels are formed at positions corresponding to the pixels so as to cover the black matrix 10. The sealing mother substrate 109 is made of glass or a synthetic resin, and transparent to visible light. The black matrix 10 may be formed of any material as long as the material is black to visible light, that is, the material has a light-absorptive property. For example, one obtained by mixing carbon into polyimide or an acrylic synthetic resin may be used. The color filters 11 are colored in red, green, and blue by mixing colorant materials into any synthetic resin, for example, an acrylic synthetic resin.

Further, an overcoat layer 12 is formed so as to cover the color filters 11, so that the color filters 11 are protected and a surface of the sealing mother substrate 109 is planarized in the display area 21. A space between the overcoat layer 12 and the sealing layer 8 is filled with a filler 13. An inside area, including the display area 21, surrounded by a sealing material 14 provided in a frame shape in the picture-frame area 27 is filled with the filler 13. Both the filler 13 and the sealing material 14 are appropriate organic materials, for which a chemically reactive or ultraviolet-curable synthetic resin is preferably used.

Due to the structure described above, when holes and electrons corresponding to an amount controlled by the electric circuit disposed in the circuit layer 2 are injected through the lower electrode 4 and the upper electrode 7 into the EL layer 6 located at the position corresponding to each of the pixels of the EL display device 100, the EL layer 6 emits light at a luminance in response to the amount of current. The polarities of the lower electrode 4 and the upper electrode 7 are not particularly limited, but, in the embodiment, the lower electrode 4 functions as an anode and the upper electrode 7 functions as a cathode. Moreover, as is apparent from the above description and FIG. 1, the EL display device 100 is of so-called top emission type, in which emitted light is extracted toward the front side of the array substrate 1.

The array mother substrate 101 and the sealing mother substrate 109 that constitute the mother glass are cut, in a state of being bonded together as shown in FIG. 3, at the positions of the cut lines 110, so that the EL display devices 100 are separated into individual pieces. A discard area 111 interposed between the cut lines 110 is not used as a product and is discarded.

In the configuration described above, when forming the EL display devices 100 on the mother glass, the layers below the EL layer 6 of the array mother substrate 101, that is, the pixel separation film 5, the lower electrode 4, the reflective layer 3, and the circuit layer 2 can be formed by a usual photolithography technique. Moreover, for the overcoat layer 12 and the layers thereon of the sealing mother substrate, that is, for the color filter 11 and the black matrix 10, a photolithography technique can also be used.

However, since the EL layer 6 is deteriorated due to oxygen or moisture as described above, a usual photolithography technique including a wet process such as etching cannot be used for the EL layer 6 and the layers thereon up to the overcoat layer 12. In the embodiment, therefore, the formation is performed while preventing the mixing of oxygen or moisture as follows: the EL layer 6 is formed by vapor deposition; the upper electrode 7 is formed by sputtering; the sealing layer 8 is formed by CVD (Chemical Vapor Deposition); the filling of the filler 13 is performed by dropping; and the sealing material 14 is coated by a dispenser.

In this case, in the formation of the EL layer 6, the upper electrode 7, and the sealing layer 8, a mask such as a metal mask is not used, and the formation of the layers is performed on the entire surface of the mother glass. Therefore, the EL layer 6, the upper electrode 7, and the sealing layer 8 are formed also in the discard area 111 as shown in FIG. 3.

Here, considering a state where the mother glass is cut at the cut lines 110, the EL layer 6 is exposed at the cut plane. Therefore, it is necessary to prevent the EL layer 6 in the display area 21 from deteriorating caused by moisture or oxygen entering from the exposed portion at the cut plane into the interior.

In the embodiment, therefore, a groove 28 surrounding the display area 21 is provided in the EL layer 6 in the picture-frame area 27, so that the pixel separation film 5 as an insulating film below the EL layer 6 is exposed through the EL layer 6 in a plan view. Then, the upper electrode 7 is provided so as to cover the groove 28, and as a result, the upper electrode 7 and the pixel separation film 5 contact each other at the groove 28. The moisture or oxygen entered from the cut plane is blocked by the groove 28, and does not enter further into the interior. Therefore, the deterioration of the EL layer 6 in the display area 21 is prevented.

The formation of the groove 28 is performed by partially removing the EL layer 6 by an appropriate method after forming the EL layer 6. Examples of specific methods include a so-called laser ablation method and a method in which a sacrificial layer having the same shape as the groove 28 is previously formed on the pixel separation film 5 and the sacrificial layer is stripped after forming the EL layer 6.

That is, in a method for manufacturing the EL display device 100 in the embodiment, first, the circuit layer 2, the reflective layer 3 if necessary, the lower electrode 4, and the pixel separation film 5 are formed on the array mother substrate 101 by an appropriate method such as photolithography. Thereafter, the EL layer 6 is formed on the entire surface of the array mother substrate 101, and further, the groove 28 is formed. Thereafter, the upper electrode 7 and the sealing layer 8 are formed. Further, the sealing material 14 is coated in the picture-frame area 27, the filling of the filler 13 is performed, the sealing mother substrate 109 separately prepared with the black matrix 10, the color filters 11, and the overcoat layer 12 formed thereon is bonded to the array mother substrate 101, and the sealingmaterial 14 and the filler 13 are cured. Finally, the mother glass is cut at the cut lines 110, and necessary wiring and the mounting of the driver circuit 24 are performed, whereby the individual EL display devices 100 are obtained.

In the embodiment, in the picture-frame area 27, the upper electrode 7 and the pixel separation film 5 contact each other in the groove 28 surrounding the display area 21, and therefore, the entry of moisture or oxygen into the EL layer 6 in the display area 21 is prevented. Moreover, since a metal mask is not needed in forming of the EL layer 6 and the upper electrode 7, the manufacturing cost is reduced.

This point will be described in detail. In order to maximize the production number of the EL display devices 100 per mother glass by increasing the size of the mother glass or reducing the cost for discarding, it is desirable for the discard area 111 to have a width as narrow as possible. However, a certain degree of width is needed for an area to be masked for ensuring the accuracy or strength of a metal mask; while if a metal mask is not used, the width can be minimized, and the cost of a metal mask itself as a consumption article can also be reduced.

Embodiment 2

Subsequently, an EL display device 200 according to a second embodiment of the invention will be described with reference to the drawing. The external appearance of the EL display device 200 is the same as that of the EL display device 100 according to the afore-mentioned first embodiment shown in FIG. 1, and the state of the EL display device 200 during manufacture is the same as that shown in FIG. 2. Therefore, FIGS. 1 and 2 are cited as drawings of the second embodiment. Moreover, in the description of the EL display device 200 according to the embodiment, the same or equivalent configurations as those of the first embodiment are denoted by the same reference numerals and signs, and a redundant description is omitted.

Figure 4:
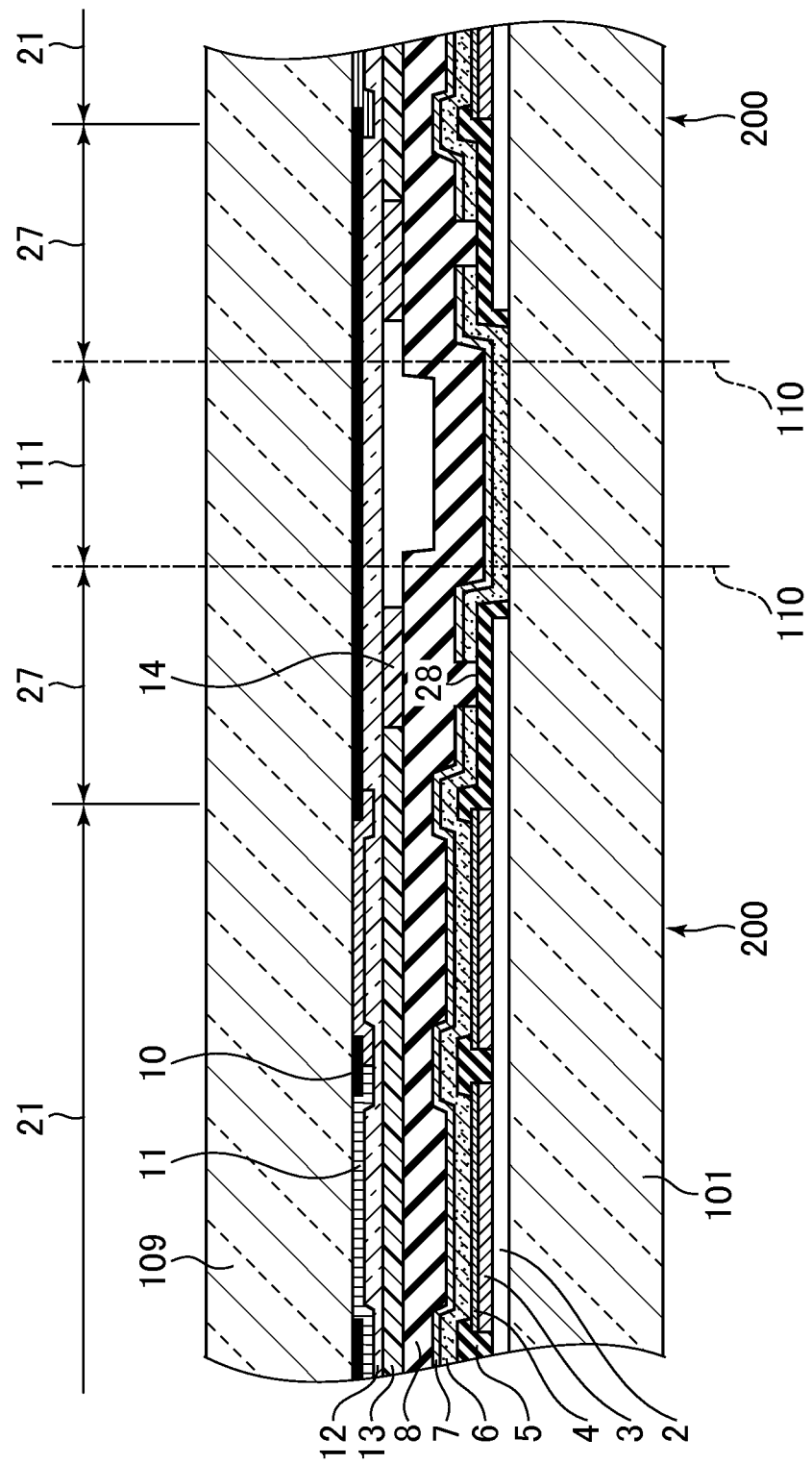
FIG. 4 is a schematic view of a cross-section of an EL display device according to a second embodiment of the invention, taken along the line III-III in FIG. 2.

FIG. 4 is a schematic view of a cross-section of the EL display device 200 according to the second embodiment of the invention, taken along the line in FIG. 2.

Also in the embodiment, the groove 28 is provided in the picture-frame area 27 so as to surround the display area 21. In this case, however, the groove 28 is provided so as to penetrate the upper electrode 7 in addition to the EL layer 6. That is, in the plan view, the groove 28 is provided so as to expose the pixel separation film 5 as an insulating film below the EL layer 6 and the upper electrode 7. Then, the sealing layer 8 is provided so as to cover the groove 28, and as a result, the sealing layer 8 and the pixel separation film 5 contact each other at the groove 28. Also in the embodiment, the moisture or oxygen entered from the cut plane is blocked by the groove 28, and does not enter further into the interior. Therefore, the deterioration of the EL layer 6 in the display area 21 is prevented. Further, also as to the upper electrode 7, since a connection from a portion exposed at the cut plane to the display area 21 is blocked and disconnected by the groove 28, electrical noise from the cut plane, for example, static electricity does not enter into the upper electrode 7 in the display area 21. Therefore, the malfunction or damage of the EL display device 200 is prevented.

The formation of the groove 28 is performed by partially removing simultaneously the EL layer 6 and the upper electrode 7 by an appropriate method after forming the EL layer 6 and the upper electrode 7. Examples of specific methods include, similarly to the afore-mentioned embodiment, a so-called laser ablation method and a method in which a sacrificial layer having the same shape as the groove 28 is previously formed on the pixel separation film 5 and the sacrificial layer is stripped after forming the EL layer 6 and the upper electrode 7.

In the embodiment, since the sealing layer 8 and the pixel separation film 5 contact each other, the entry of moisture or oxygen into the EL layer 6 in the display area 21 is prevented, and the entry of electrical noise into the upper electrode 7 in the display area 21 is prevented. Moreover, since a metal mask is not needed in forming of the EL layer 6 and the upper electrode 7, the manufacturing cost is reduced.

Embodiment 3

Subsequently, an EL display device 300 according to a third embodiment of the invention will be described with reference to the drawing. The external appearance of the EL display device 300 is the same as that of the EL display device 100 according to the afore-mentioned first embodiment shown in FIG. 1, and the state of the EL display device 300 during manufacture is the same as that shown in FIG. 2. Therefore, FIGS. 1 and 2 are cited as drawings of the third embodiment. Moreover, in the description of the EL display device 300 according to the embodiment, the same or equivalent configurations as those of the first embodiment are denoted by the same reference numerals and signs, and a redundant description is omitted.

Figure 5:
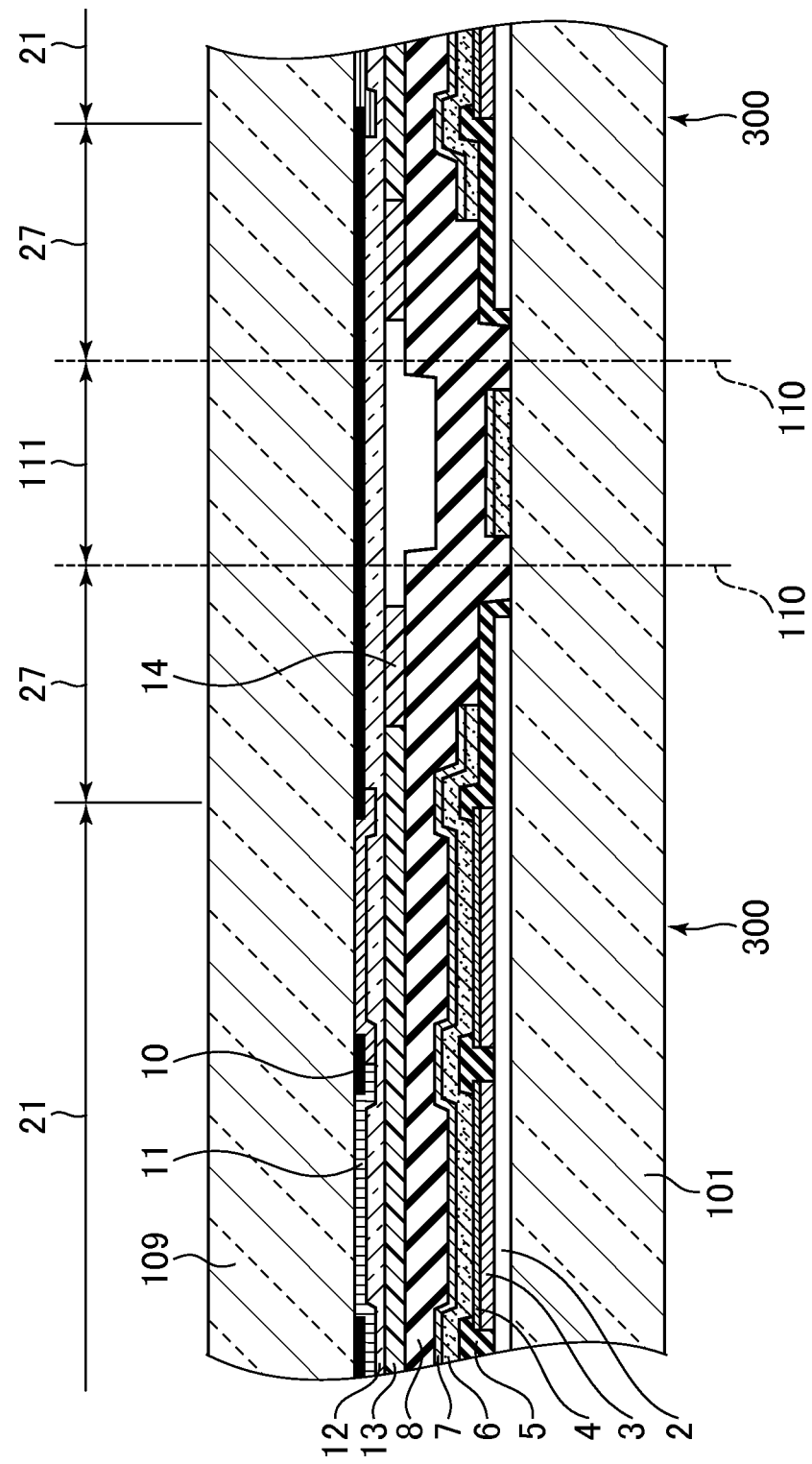
FIG. 5 is a schematic view of a cross-section of an EL display device according to a third embodiment of the invention, taken along the line III-III in FIG. 2.

FIG. 5 is a schematic view of a cross-section of the EL display device 300 according to the third embodiment of the invention, taken along the line III-III in FIG. 2.

Also in the embodiment, the sealing layer 8 and the pixel separation film 5 are in contact with each other, in the picture-frame area 27, so as to surround the display area 21. However, this contact area is not defined by the groove but extends to the cut plane. Also in such a structure, the entry of moisture or oxygen from the cut plane into the EL layer 6 in the display area 21 is prevented, and the entry of electrical noise from the cut plane into the display area 21 is prevented.

The EL display device 300 according to the embodiment can be obtained by previously forming, in the picture-frame area 27, a sacrificial layer covering the pixel separation film 5 to the cut line 110, forming the EL layer 6 and the upper electrode 7, and then stripping the sacrificial layer. In this case, since the EL layer 6 and the upper electrode 7 are simultaneously stripped by the stripping of the sacrificial layer, the positions of edge faces of the EL layer 6 and the upper electrode 7 are the same as each other in the plan view.

Also in the embodiment, since the sealing layer 8 and the pixel separation film 5 contact each other, the entry of moisture or oxygen into the EL layer 6 in the display area 21 is prevented, and the entry of electrical noise into the upper electrode 7 in the display area 21 is prevented. Moreover, since a metal mask is not needed in forming of the EL layer 6 and the upper electrode 7, the manufacturing cost is reduced.

Embodiment 4

Subsequently, an EL display device 400 according to a fourth embodiment of the invention will be described with reference to the drawing. The external appearance of the EL display device 400 is the same as that of the EL display device 100 according to the afore-mentioned first embodiment shown in FIG. 1, and the state of the EL display device 400 during manufacture is the same as that shown in FIG. 2. Therefore, FIGS. 1 and 2 are cited as drawings of the fourth embodiment. Moreover, in the description of the EL display device 400 according to the embodiment, the same or equivalent configurations as those of the first embodiment are denoted by the same reference numerals and signs, and a redundant description is omitted.

Figure 6:
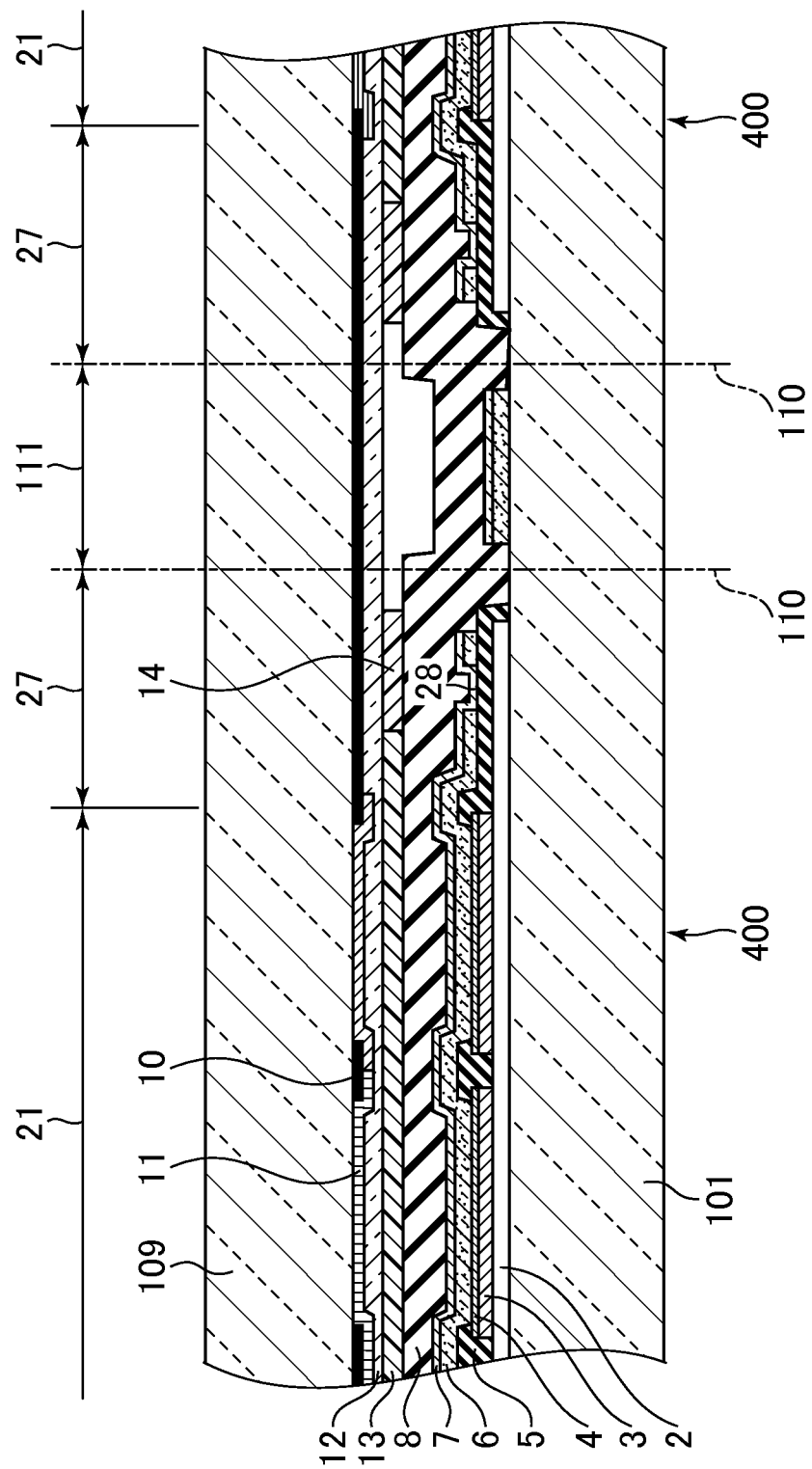
FIG. 6 is a schematic view of a cross-section of an EL display device according to a fourth embodiment of the invention, taken along the line III-III in FIG. 2.

FIG. 6 is a schematic view of a cross-section of the EL display device 400 according to the fourth embodiment of the invention, taken along the line in FIG. 2.

Also in the embodiment, the groove 28 is provided in the picture-frame area 27 so as to surround the display area 21, the groove 28 penetrates the EL layer 6, and the pixel separation film 5 as an insulating film below the EL layer 6 is exposed through the EL layer 6 in the plan view. Further, the sealing layer 8 and the pixel separation film 5 are in contact with each other, in the picture-frame area 27 and on the outer peripheral side of the groove 28, so as to surround the display area 21 and the groove 28.

In this structure, the entry of moisture or oxygen into the EL layer 6 in the display area 21 is securely prevented by double protection afforded by contact of the sealing layer 8 with the pixel separation film 5 and contact of the upper electrode 7 with the pixel separation film 5. Moreover, the entry of electrical noise into the upper electrode 7 in the display area 21 is prevented by contact of the sealing layer 8 with the pixel separation film 5.

The EL display device 400 according to the embodiment can be obtained as follows: a sacrificial layer is previously formed on the pixel separation film 5 outside a position at which the groove 28 is to be formed in the picture-frame area 27; the EL layer 6 is formed; the groove 28 is formed by an appropriate method such as a laser ablation method; the upper electrode 7 is formed; and then, the sacrificial layer is stripped. Also in this case, since the EL layer 6 and the upper electrode 7 are simultaneously stripped by the stripping of the sacrificial layer, the positions of edge faces of the EL layer 6 and the upper electrode 7 are the same as each other in the plan view.

In the embodiment, the entry of moisture or oxygen into the EL layer 6 in the display area 21 is doubly prevented by contact of the sealing layer 8 with the pixel separation film 5 and contact of the upper electrode 7 with the pixel separation film 5, and further, the entry of electrical noise into the upper electrode 7 in the display area 21 is also prevented. Moreover, since a metal mask is not needed in forming of the EL layer 6 and the upper electrode 7, the manufacturing cost is reduced.

Embodiment 5

Subsequently, an EL display device 500 according to a fifth embodiment of the invention will be described with reference to the drawing. The external appearance of the EL display device 500 is the same as that of the EL display device 100 according to the afore-mentioned first embodiment shown in FIG. 1, and the state of the EL display device 500 during manufacture is the same as that shown in FIG. 2. Therefore, FIGS. 1 and 2 are cited as drawings of the fifth embodiment. Moreover, in the description of the EL display device 500 according to the embodiment, the same or equivalent configurations as those of the first embodiment are denoted by the same reference numerals and signs, and a redundant description is omitted.

Figure 7:
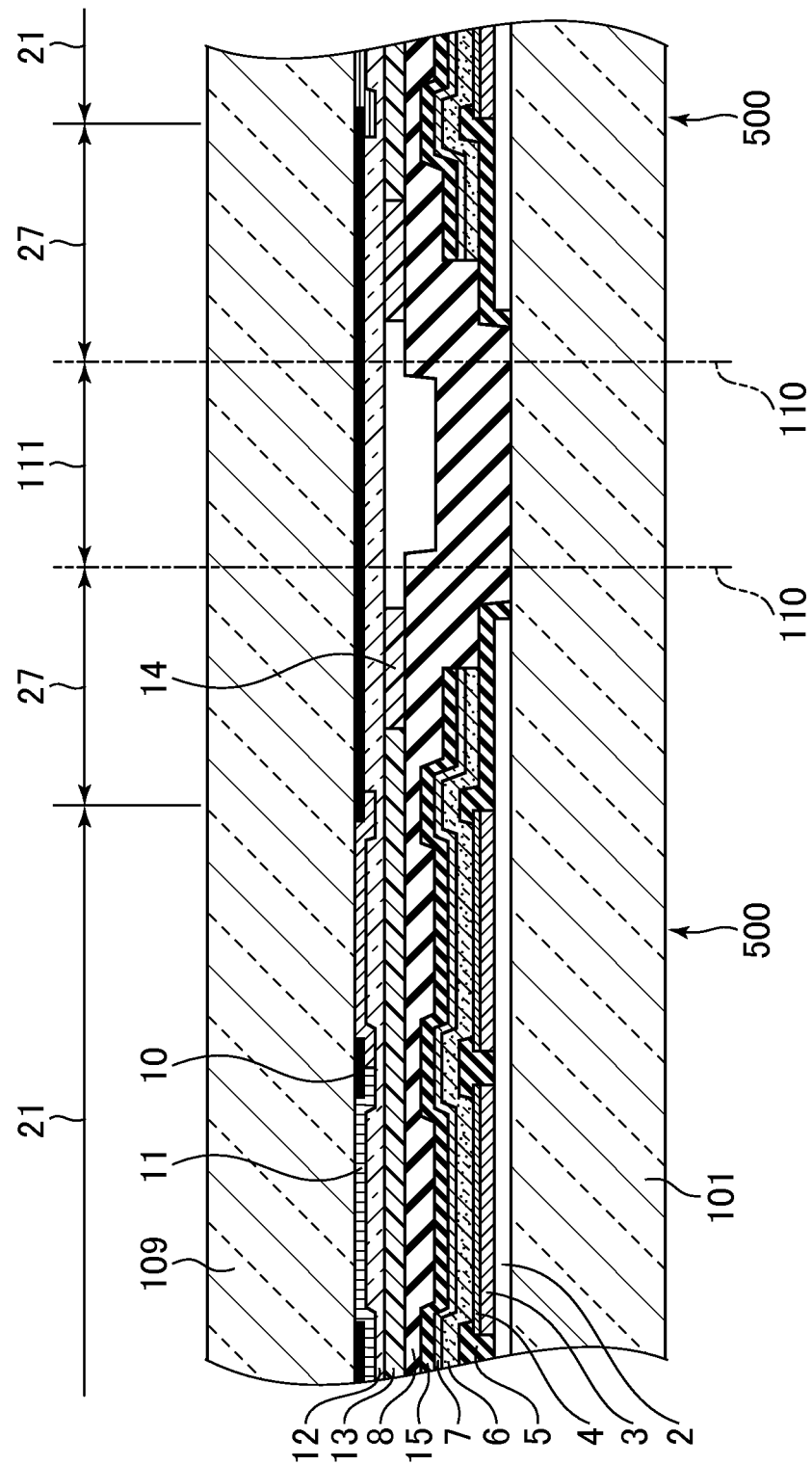
FIG. 7 is a schematic view of a cross-section of an EL display device according to a fifth embodiment of the invention, taken along the line III-III in FIG. 2.

FIG. 7 is a schematic view of a cross-section of the EL display device 500 according to the fifth embodiment of the invention, taken along the line III-III in FIG. 2.

In the embodiment, similarly to the afore-mentioned third embodiment, the sealing layer 8 and the pixel separation film 5 are in contact with each other so as to surround the display area 21, and this contact area extends to the cut plane. Hence, also in the embodiment, similarly to the third embodiment, the entry of moisture or oxygen from the cut plane into the EL layer 6 in the display area 21 is prevented, and the entry of electrical noise from the cut plane into the upper electrode 7 in the display area 21 is prevented.

In the embodiment, a second sealing layer 15 is provided so as to cover the EL layer 6 and the upper electrode 7, and the positions of edge faces of the EL layer 6, the upper electrode 7, and the second sealing layer 15 coincide with each other in the plan view. This is because, in the making of the EL display device 500 according to the embodiment, the EL display device 500 is obtained by making the EL layer 6 and the upper electrode 7 over the entire surface of the array mother substrate 101, making the second sealing layer 15 so as to cover the display area 21 and a portion of the picture-frame area 27, and then, removing exposed portions of the EL layer 6 and the upper electrode 7 by a removing process using the second sealing layer 15 as a protective layer, for example, by dry etching.

In this structure, since the sealing layer 8 and the pixel separation film 5 contact each other, the entry of moisture or oxygen into the EL layer 6 in the display area 21 is prevented, and the entry of electrical noise into the upper electrode 7 in the display area 21 is prevented. Moreover, since a metal mask is not needed in forming of the EL layer 6 and the upper electrode 7, the manufacturing cost is reduced. Further, since the second sealing layer 15 and the sealing layer 8 are stacked on each other in the display area 21, the EL layer 6 in the display area 21 is securely protected.

Embodiment 6

Subsequently, an EL display device 600 according to a sixth embodiment of the invention will be described with reference to the drawing. The external appearance of the EL display device 600 is the same as that of the EL display device 100 according to the afore-mentioned first embodiment shown in FIG. 1, and the state of the EL display device 600 during manufacture is the same as that shown in FIG. 2. Therefore, FIGS. 1 and 2 are cited as drawings of the sixth embodiment. Moreover, in the description of the EL display device 600 according to the embodiment, the same or equivalent configurations as those of the first embodiment are denoted by the same reference numerals and signs, and a redundant description is omitted.

FIG. 8 is a schematic view of a cross-section of the EL display device 600 according to the sixth embodiment of the invention, taken along the line in FIG. 2.

The embodiment employs a structure in which the upper electrode 7 contacts the pixel separation film 5 at the periphery of the EL layer 6 in the picture-frame area 27, and further, the sealing layer 8 contacts the pixel separation film 5 at the periphery of the upper electrode 7 in the picture-frame area 27. That is, the external shape of the upper electrode 7 is somewhat larger than the external shape of the EL layer 6, and edges of both the EL layer 6 and the upper electrode 7 are contained in the picture-frame area 27. Also in this structure, similarly to the fourth embodiment, the entry of moisture or oxygen into the EL layer 6 in the display area 21 is securely prevented by double protection afforded by contact of the sealing layer 8 with the pixel separation film 5 and contact of the upper electrode 7 with the pixel separation film 5. Moreover, the entry of electrical noise into the upper electrode 7 in the display area 21 is prevented by contact of the sealing layer 8 with the pixel separation film 5.

In the EL display device 600 according to the embodiment, two types of metal masks are used. That is, the EL layer 6 is formed by vapor deposition using a first metal mask, and subsequently, the upper electrode 7 is formed using a second metal mask. The size of an opening in the second metal mask is somewhat larger than the size of an opening in the first metal mask.

In the embodiment, the entry of moisture or oxygen into the EL layer 6 in the display area 21 is doubly prevented by contact of the sealing layer 8 with the pixel separation film 5 and contact of the upper electrode 7 with the pixel separation film 5, and further, the entry of electrical noise into the upper electrode 7 in the display area 21 is also prevented. However, since the metal masks are used in forming the EL layer 6 and the upper electrode 7, the cost of the metal masks is needed.

The specific shape, arrangement, number, and the like of each member shown in the embodiments described above are illustrative only, and the invention is not limited to them. Those skilled in the art may optionally design or modify the shape and the like of each member according to embodiments when implementing the invention. Moreover, the embodiments may be appropriately combined together.

In other words, while there have been described what are at present considered to be certain embodiments of the invention, it will be understood that various modifications may be made thereto, and it is intended that the appended claims cover all such modifications as fall within the true spirit and scope of the invention.

What is claimed is:

1. An EL display device comprising:
    a display area having a plurality of pixels;
    a frame area surrounding the display area;
    lower electrodes each formed in each of the pixels;
    an insulating layer separating the pixels;
    a light-emitting EL layer formed on the lower electrodes and the insulating layer;
    an upper electrode formed on the EL layer so as to straddle the plurality of pixels; and
    a sealing layer formed on the upper electrode, wherein
    in the frame area, the upper electrode and the insulating layer contact each other, and the sealing layer and the insulating layer contact each other, so as to surround the display area.

2. The EL display device according to claim 1, wherein
    a second sealing layer is formed on the upper electrode, and
    the sealing layer and the insulating layer contact each other on an outer peripheral side of the second sealing layer.

3. The EL display device according to claim 1, wherein
    in the frame area, a groove is formed in the EL layer or the EL layer and the upper electrode so as to surround the display area, and
    the upper electrode and the insulating layer or the sealing layer and the insulating layer contact each other at the groove.

4. The EL display device according to claim 3, wherein
    the upper electrode and the insulating layer contact each other at the groove, and
    the sealing layer and the insulating layer contact each other on an outer peripheral side of the groove.

5. An EL display device comprising:
    a display area having a plurality of pixels;
    a frame area surrounding the display area;
    lower electrodes each formed in each of the pixels;
    a second insulating layer;
    a light-emitting EL layer formed on the lower electrodes and the second insulating layer so as to straddle the plurality of pixels;
    an upper electrode formed on the EL layer so as to straddle the plurality of pixels; and
    a sealing layer formed on the upper electrode,
    wherein the lower electrodes, the second insulating layer, the light-emitting EL layer and the upper electrode are formed on an array substrate which is a substrate on which a first insulating layer and a circuit layer which includes a transistor are formed,
    wherein a first region in which the upper electrode and the second insulating layer contact each other or the sealing layer and the second insulating layer contact each other and a second region in which the substrate and the sealing layer contact each other with removing the circuit layer at a position nearer to an edge of the substrate than the first region are included in the frame area so as to surround the display area.

* * * * *